(12) United States Patent
Jang

(10) Patent No.: US 8,969,114 B2
(45) Date of Patent: Mar. 3, 2015

(54) METHOD OF MANUFACTURING ORGANIC LIGHT EMITTING DISPLAY APPARATUS

(71) Applicant: Samsung Display Co., Ltd., Yongin, Gyeonggi-Do (KR)

(72) Inventor: Joo-Nyung Jang, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/040,262

(22) Filed: Sep. 27, 2013

(65) Prior Publication Data

US 2014/0356999 A1 Dec. 4, 2014

(30) Foreign Application Priority Data

May 31, 2013 (KR) ........................ 10-2013-0063077

(51) Int. Cl.
| | |
|---|---|
| *H01L 21/00* | (2006.01) |
| *H01L 51/56* | (2006.01) |
| *H01L 27/32* | (2006.01) |
| *H01L 51/00* | (2006.01) |
| *H01L 21/67* | (2006.01) |

(52) U.S. Cl.
CPC ............ *H01L 51/56* (2013.01); *H01L 27/3274* (2013.01); *H01L 51/0011* (2013.01); *H01L 21/6715* (2013.01); *H01L 51/001* (2013.01); *H01L 27/32* (2013.01)
USPC .......... 438/34; 438/99; 257/40; 257/E51.001; 118/720; 204/192.25; 204/192.26; 204/192.29; 427/124; 427/447

(58) Field of Classification Search
CPC ............ H01L 51/0011; H01L 27/3274; H01L 21/6715; H01L 27/32; H01L 51/001
USPC ......... 438/34, 99; 257/40, E51.001; 118/720; 204/192.25, 192.26, 192.29; 427/124, 427/447

See application file for complete search history.

(56) References Cited

U.S. PATENT DOCUMENTS

| | | | | |
|---|---|---|---|---|
| 2001/0006827 | A1* | 7/2001 | Yamazaki et al. | 438/30 |
| 2003/0232563 | A1* | 12/2003 | Kamiyama et al. | 445/24 |
| 2006/0045958 | A1* | 3/2006 | Abiko et al. | 427/66 |
| 2006/0267002 | A1* | 11/2006 | Fischer et al. | 257/40 |
| 2013/0008379 | A1 | 1/2013 | Chang et al. | |
| 2013/0186335 | A1* | 7/2013 | Kawato et al. | 118/720 |
| 2013/0341598 | A1* | 12/2013 | Chang et al. | 257/40 |
| 2014/0014917 | A1* | 1/2014 | Lee et al. | 257/40 |
| 2014/0014929 | A1* | 1/2014 | Lee et al. | 257/40 |
| 2014/0084263 | A1* | 3/2014 | Jin et al. | 257/40 |

FOREIGN PATENT DOCUMENTS

| | | |
|---|---|---|
| KR | 1020060055485 | 5/2006 |
| KR | 1020080062844 | 7/2008 |

* cited by examiner

*Primary Examiner* — Bac Au
(74) *Attorney, Agent, or Firm* — Innovation Counsel LLP

(57) ABSTRACT

A method of manufacturing an organic light emitting display apparatus, the method includes loading a substrate on a moving unit, determining an angle formed between a side of the substrate and an opening in a patterning slit sheet, rotating the patterning slit sheet by two X motors so that the side of the substrate and the opening in a patterning slit sheet extend along the same direction and forming a layer on the substrate while conveying the substrate on the moving unit in the first direction in a chamber. The patterning slit sheet moves along a direction perpendicular to the first direction during the forming the layer on the substrate so that a deposition layer having a linear pattern that extends along the first direction is formed on the substrate.

12 Claims, 7 Drawing Sheets

METHOD OF MANUFACTURING ORGANIC LIGHT EMITTING DISPLAY APPARATUS

CROSS-REFERENCE TO RELATED PATENT APPLICATION

This application claims the benefit of Korean Patent Application No. 10-2013-0063077, filed on May 31, 2013, in the Korean Intellectual Property Office, the disclosure of which is incorporated herein in its entirety by reference.

BACKGROUND

1. Field of the Invention

Embodiments of the present invention relate a method of manufacturing an organic light emitting display.

2. Description of the Related Art

Organic light-emitting display devices have wider viewing angles, better contrast characteristics, and faster response speeds than other display devices, and thus have drawn attention as a next-generation display device.

An organic light-emitting display device includes intermediate layers (including an emission layer) disposed between a first electrode and a second electrode facing each other. The electrodes and the intermediate layers may be formed using various methods, one of which is an independent deposition method. When an organic light-emitting display device is manufactured by using the deposition method, a fine metal mask (FMM) having the same pattern as that of a layer to be formed is disposed to closely contact a substrate on which the layer and the like are formed, and a material is deposited on the FMM to form the layer having the desired pattern.

However, the deposition method using such an FMM presents difficulties of having to use a large FMM when manufacturing large organic light-emitting display devices using a large mother glass or when simultaneously manufacturing a plurality of organic light emitting display devices by using a large mother-substrate. In this case, when such a large mask is used, the mask may bend due to self-gravity, and this may make it impossible to form an intermediate layer having a previously set and accurate pattern. Moreover, processes of aligning a substrate and an FMM to closely contact each other, performing deposition thereon, and separating the FMM from the substrate are time-consuming, resulting in a long manufacturing time and low production efficiency.

SUMMARY OF THE INVENTION

Embodiments of the present invention are directed to address at least the above problems relating to the deposition method using the FMM.

According to one aspect of the present invention, there is provided a method of manufacturing an organic light emitting display apparatus, the method including: loading a substrate on a moving unit, wherein the moving unit is configured to move along a first direction; determining an angle formed between a side of the substrate and an opening in a patterning slit sheet, wherein the side of the substrate and the opening in a patterning slit sheet substantially extends along the first direction; rotating the patterning slit sheet by two X motors so that the side of the substrate and the opening in a patterning slit sheet extend along the same direction, a first X motor of the two X motors configured to move the substrate in one predetermined direction and a second X motor of the two X motors configured to move the substrate in the other predetermined direction opposite to said one predetermined direction while rotating the patterning slit sheet, the first X motor and the second X motor configured to move the substrate by the same distance; forming a layer on the substrate while conveying the substrate on the moving unit in the first direction in a chamber. The patterning slit sheet may move along a direction perpendicular to the first direction during the forming the layer on the substrate so that a deposition layer having a linear pattern that extends along the first direction is formed on the substrate.

The rotating the patterning slit sheet may be performed before the substrate overlaps the patterning slit sheet.

The patterning slit sheet may move in real time during the forming the layer on the substrate.

The two X motors are spaced apart from each other along a virtual straight line in the first direction, the virtual straight line passing through a center of the moving unit.

The two X motors may be configured to move the patterning slit sheet in a same direction by the same distance during the forming the layer on the substrate. The same direction may be substantially perpendicular to the first direction.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
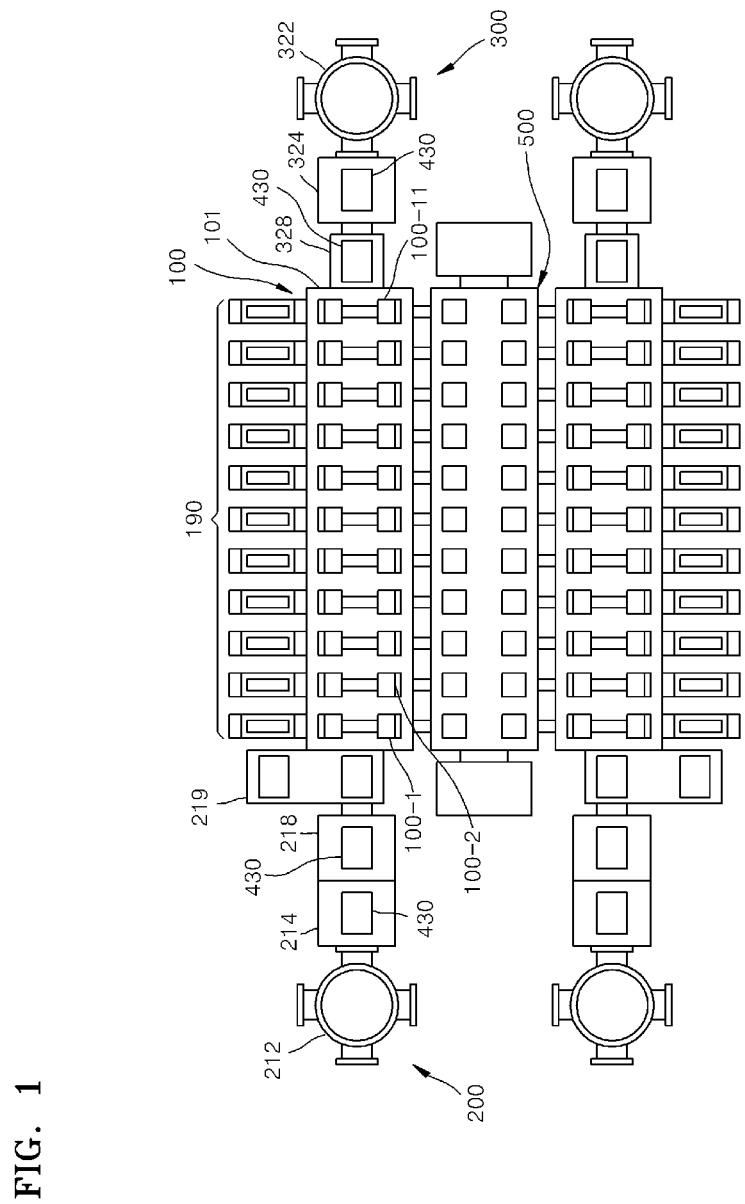
FIG. 1 is a conceptual plan view schematically illustrating a deposition apparatus according to an embodiment of the present invention.

Hereinafter, embodiments of the present invention will be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, for convenience of description, sizes of elements may be exaggerated or reduced. For example, as sizes and thicknesses of elements illustrated in the drawings are provided arbitrarily, the invention is not limited to the illustrated drawings.

Also, meanings of an x-axis, a y-axis, and a z-axis are not limited to three axes on an orthogonal coordinates system, but may be wider. For example, the x-, y-, and z-axes may cross each other at right angles, but may alternatively denote other directions that do not cross each other at right angles.

It will also be understood that when a component, such as a layer, a film, a region, or a plate, is referred to as being "on" another component, it can be directly on the other component, or an intervening component may also be present.

As used herein, the term "and/or" includes any and all combinations of one or more of the associated listed items. Expressions such as "at least one of," when preceding a list of elements, modify the entire list of elements and do not modify the individual elements of the list.

Figure 2:
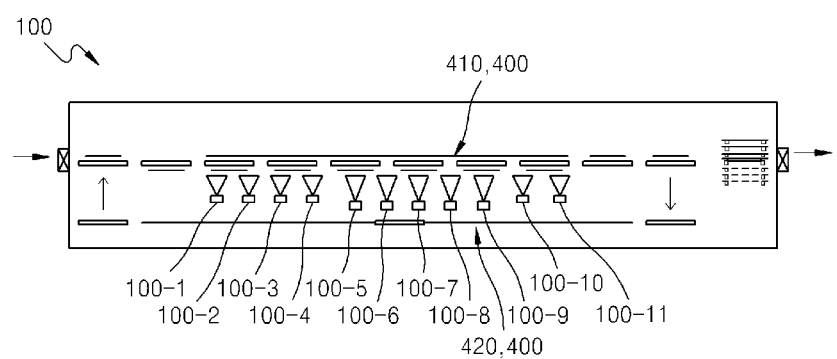
FIG. 2 is a conceptual side view schematically illustrating a portion of the deposition apparatus including a deposition unit according to an embodiment of the present invention.

FIG. 1 is a conceptual plane view schematically illustrating a deposition apparatus according to an embodiment of the present invention. FIG. 2 is a conceptual side view schematically illustrating a portion of the deposition apparatus including a deposition unit 100 according to an embodiment of the present invention.

Referring to FIGS. 1 and 2, the deposition apparatus according to the current embodiment of the present invention includes the deposition unit 100, a loading unit 200, an unloading unit 300, a conveyer unit 400, and a patterning slit sheet replacement unit 500. The conveyer unit 400 may include a first conveyer unit 410 that conveys a moving unit 430, to which a substrate 2 (refer to FIG. 3 or the like) is detachably loaded, in a first direction and a second conveyer unit 420 that conveys the moving unit 430 separated from the substrate 2, in an opposite direction to the first direction.

The loading unit 200 may include a first rack 212, a transport chamber 214, a first inversion chamber 218, and a buffer chamber 219.

A plurality of substrates 2 onto which a deposition material has not yet been applied are stacked up on the first rack 212. A transport robot picks up one of the substrates 2 from the first rack 212, disposes it on the moving unit 430 included in the transport chamber 214 transferred by using the second conveyer unit 420 to be disposed in the transport chamber 214. The substrate 2 may be loaded on the moving unit 430 by using a clamp or the like, and the moving unit 430 to which the substrate 2 is loaded is transported to the first inversion chamber 218. Alternatively, the substrate 2 may also be aligned with the moving unit 430 according to necessity before fixing the substrate 2 to the moving unit 430.

The first inversion chamber 218 is disposed adjacent to the transport chamber 214, and here, a first inversion robot inverts the moving unit 430. Consequently, the transport robot places the substrate 2 on a top surface of the moving unit 430, and the moving unit 430 is then transferred into the first inversion chamber 218 such that a surface of the substrate 2 opposite to a surface thereof facing the moving unit 430 is faced upward. As the first inversion robot inverts the first inversion chamber 218, the surface of the substrate 2 opposite to the surface thereof facing the moving unit 430 is turned to face downward. Then, the first conveyer unit 410 conveys the moving unit 430 on which the substrate 2 is loaded.

The unloading unit 300 is configured to operate in an opposite manner to the loading unit 200 described above. Specifically, a second inversion robot in a second inversion chamber 328 inverts the substrate 2 and the moving unit 430, which have passed through the deposition unit 100, and conveys the same to an ejection chamber 324, and the substrate 2 is separated from the moving unit 430 in the ejection chamber 324, and, for example, an ejection robot loads the substrate 2 on a second rack 322. The moving unit 430, separated from the substrate 2, is returned to the loading unit 200 via the second conveyer unit 420.

However, the present invention is not limited to the above example. For example, when disposing the substrate 2 on the moving unit 430 initially, the substrate 2 may be loaded onto a bottom surface of the moving unit 430 and then moved into the deposition unit 100. In such an embodiment, for example, the first inversion robot of the first inversion chamber 218 and the second inversion robot of the second inversion chamber 328 may be omitted. Alternatively, the first inversion robot of the first inversion chamber 218 and the second inversion robot of the second inversion chamber 328 may not respectively invert the first inversion chamber 218 and the second inversion chamber 328 but only invert the moving unit 430 to which the substrate 2 is loaded, respectively, within the first inversion chamber 218 and the second inversion chamber 328. In this case, a method may be used, in which a conveyer unit in an inversion chamber is rotated while the moving unit 430 is disposed on the conveyer unit in the inversion chamber, wherein the conveyer unit is capable of conveying the moving unit 430 on which the substrate 2 is loaded. The conveyer unit in the inversion chamber may be regarded as also functioning as the first inversion robot or the second inversion robot. The conveyer unit in the inversion chamber may be a portion of the first conveyer unit or a portion of the second conveyer unit.

The deposition unit 100 may include a chamber 101 as illustrated in FIGS. 1 and 2, and a plurality of deposition assemblies 100-1 through 100-n may be disposed in the chamber 101. Referring to FIG. 1, 11 deposition assemblies, i.e., a first deposition assembly 100-1, a second deposition assembly 100-2, . . . , and an eleventh deposition assembly 100-11, are disposed in the chamber 101. The number of deposition assemblies may vary with a desired deposition material and deposition conditions. The chamber 101 is maintained in vacuum or in a near-vacuum state during the deposition process.

The first conveyer unit 410 conveys the moving unit 430 with the substrate 2 loaded thereon, at least to the deposition unit 100. For example, the first conveyer unit 410 conveys the moving unit 430 with the substrate 2 loaded thereon. The first conveyer unit 410 conveys the moving unit 430 sequentially to the loading unit 200, the deposition unit 100, and the unloading unit 300. The second conveyer unit 420 returns the moving unit 430 that is separated from the substrate 2, from the unloading unit 300 to the loading unit 200. Accordingly, the moving unit 430 may be cyclically conveyed via the first conveyer unit 410 and the second conveyer unit 420.

The first conveyer unit 410 may be disposed to pass through the chamber 101 and the second conveyer unit 420 may be disposed to convey the moving unit 430 that is separated from the substrate 2.

In the present embodiment, the first conveyer unit 410 and the second conveyer unit 420 may be respectively disposed above and below. Accordingly, after deposition has been completed on the substrate 2 as the moving unit 430 has passed through the first conveyer unit 410, the substrate 2 may be separated from the moving unit 430 in the unloading unit 300 and the moving unit 430 may be returned to the loading unit 200 via the second conveyer unit 420 disposed below the first conveyer unit 410, whereby space utilization efficiency may be improved. Alternatively, differently from FIGS. 1 and 2, the second conveyer unit 420 may be disposed above the first conveyer unit 410.

As illustrated in FIG. 1, the deposition unit 100 may further include a deposition source replacement unit 190 disposed at a side of each deposition assembly. Although not particularly illustrated in the drawings, the deposition source replacement unit 190 may be formed as a cassette-type unit that may be protruded to the outside from each deposition assembly. Thus, a deposition source 110 (refer to FIG. 3) of the deposition assembly 100-1 may be easily replaced.

In addition, referring to FIG. 1, two deposition apparatuses each including the loading unit 200, the deposition unit 100, the unloading unit 300, and the conveyer unit 400 are arranged in parallel. In such an embodiment, the patterning slit sheet replacement unit 500 may be disposed between the two deposition apparatuses. That is, the two deposition apparatuses share the patterning slit sheet replacement unit 500, resulting in improved space utilization efficiency, as compared to a case where each deposition apparatus includes the patterning slit sheet replacement unit 500.

Figure 3:
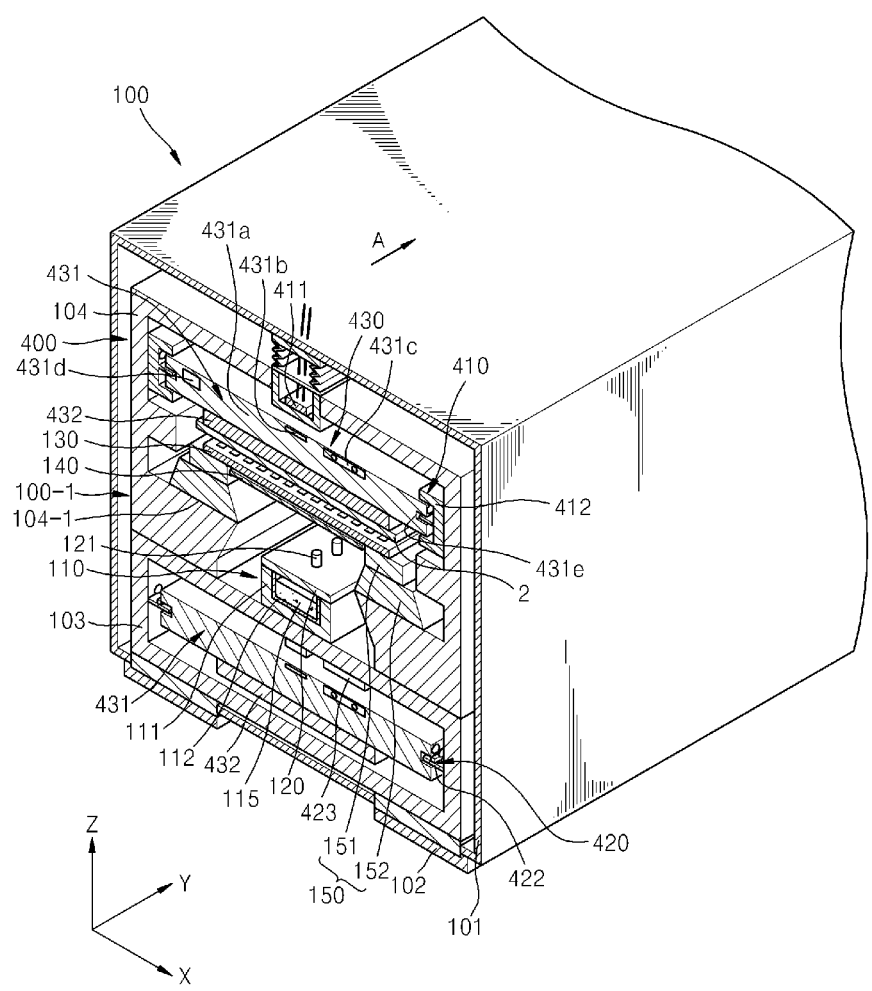
FIG. 3 is a cross-sectional perspective view schematically illustrating a portion of a deposition unit of the deposition apparatus of FIG. 1 according to an embodiment of the present invention.
Figure 4:
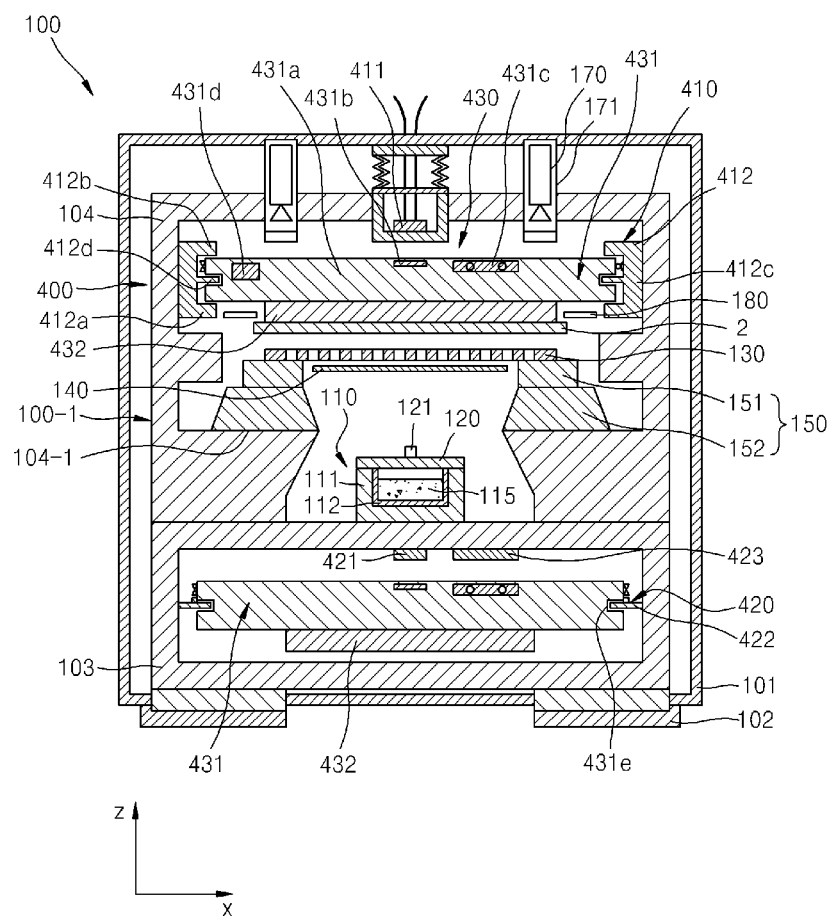
FIG. 4 is a schematic cross-sectional view illustrating a portion of a deposition unit of the deposition apparatus of FIG. 1 according to an embodiment of the present invention.

FIG. 3 is a schematic cross-sectional perspective view illustrating a portion of the deposition unit 100 of the deposition apparatus illustrated in FIG. 1 according to an embodiment of the present invention. FIG. 4 is a schematic cross-sectional view of a portion of the deposition unit 100 of FIG. 1 according to an embodiment of the present invention. Referring to FIGS. 3 and 4, the deposition unit 100 of the deposition apparatus includes the chamber 101 and the at least one deposition assembly 100-1.

The chamber 101 may be formed as a hollow box type chamber and accommodate the at least one deposition assembly 100-1. The conveyer unit 400 may also be accommodated in the chamber 101 as illustrated in FIGS. 3 and 4, or a portion of the conveyer unit 400 may be accommodated in the chamber 101 and another portion of the conveyer unit 400 may be outside the chamber 101.

In the chamber 101, a lower housing 103 and an upper housing 104 may be accommodated. In detail, the lower housing 103 may be disposed on a foot 102 which is fixable to the ground, and the upper housing 104 may be disposed on the lower housing 103. In this regard, a connection part of the lower housing 103 and the chamber 101 is sealed so that the inside of the chamber 101 is completely isolated from the outside. Due to the structure in which the lower housing 103 and the upper housing 104 are disposed on the foot 102 which is fixed on the ground, the lower housing 103 and the upper housing 104 may be maintained in a fixed position even though the chamber 101 is repeatedly contracted and expanded. Thus, the lower housing 103 and the upper housing 104 may serve as a reference frame in the deposition unit 100.

The upper housing 104 includes the deposition assembly 100-1 and the first conveyer unit 410 of the conveyer unit 400, and the lower housing 103 includes the second conveyer unit 420 of the conveyer unit 400. While the moving unit 430 is cyclically conveyed between the first conveyer unit 410 and the second conveyer unit 420, deposition may be continuously performed on the substrate 2 which is loaded on the moving unit 430. Thus, the moving unit 430 which may be cyclically conveyed may include a carrier 431 and an electrostatic chuck 432 coupled thereto.

The carrier 431 may include a main body part 431a, a linear motor system (LMS) magnet 431b, contactless power supply (CPS) modules 431c, a power supply unit 431d, and guide grooves 431e. The carrier 431 may further include cam followers 431f according to necessity.

The main body part 431a constitutes a base part of the carrier 431 and may be formed of a magnetic material such as iron. Due to an attractive force or a repulsive force between the main body part 431a of the carrier 431 and magnetically suspended bearings (not shown), the carrier 431 may maintain a predetermined space from the guide members 412 of the first conveyer unit 410. Each guide grooves 431e may accommodate a guide protrusion 412d of the guide member 412 of the first conveyer unit 410 or a roller guide 422 of the second conveyer unit 420.

Furthermore, the main body part 431a may include the LMS magnet 431b arranged along a central line of a proceeding direction (Y-axis direction). The LMS magnet 431b of the main body part 431a and the coil 411 may be combined with each other to constitute a linear motor. The carrier 431, that is, the moving unit 430, may be transported in a direction A by using the linear motor. Thus, the moving unit 430 may be conveyed according to a current applied to the coil 411 of the first conveyer unit 410 without power being supplied to the moving unit 430. To this end, a plurality of coils 411 may be arranged at predetermined intervals in the chamber 101 (in the Y-axis direction). As the coil 411 is disposed in an atmosphere (ATM) box, the coil 411 may be installed in an atmospheric state.

The main body part 431a may include the CPS modules 431c that are disposed on first and second portions of the LMS magnet 431b. The power supply unit 431d includes a battery (e.g., a rechargeable battery) that provides power so that the electrostatic chuck 432 can hold the substrate 2. The CPS modules 431c are wireless charging modules that charge the power supply unit 431d. The charging track 423 formed in the second conveyer unit 420 is connected to an inverter (not shown), and thus, when the second conveyer unit 420 conveys the carrier 431, a magnetic field is formed between the charging track 423 and the CPS modules 431c so as to supply power to the CPS module 431c, thereby charging the power supply unit 431d.

The electrostatic chuck 432 may include an electrode embedded in a main body formed of ceramic, wherein the electrode is supplied with power. The substrate 2 is attached onto a surface of the main body of the electrostatic chuck 432 as a high voltage is applied to the electrode embedded in the main body from the power supply unit 431d of the main body 431a of the carrier 431.

The first conveyer unit 410 may convey the moving unit 430 having the above-described configuration and on which the substrate 2 loaded, in the first direction (+Y direction). The first conveyer unit 410 includes the coil 411 and the guide members 412 as described above, and may further include a magnetically suspended bearing or a gap sensor or the like.

The coil 411 and the guide members 412 may be formed inside the upper housing 104. For example, the coil 411 may be formed in an upper portion of the upper housing 104, and the guide members 421 may be respectively formed on both inner sides of the upper housing 104.

As described above, the coil 411 may be combined with the LMS magnet 431b of the main body part 431a of the moving unit 430 to form a linear motor so as to move the moving unit 430. The guide members 412 may guide the moving unit 430 to be conveyed in the first direction (Y-axis direction) when the moving unit 430 moves. The guide members 412 may be disposed to pass through the deposition unit 100.

In particular, the guide members 412 may accommodate both sides of the carrier 431 of the moving unit 430 to guide the carrier 431 to move along in the direction A illustrated in FIG. 3. In this regard, the guide members 412 may include a first accommodation part 412a disposed below the carrier 431, a second accommodation part 412b disposed above the carrier 431, and a connection part 412c that connects the first accommodation part 412a and the second accommodation part 412b. An accommodation groove may be formed by the first accommodation part 412a, the second accommodation part 412b, and the connection part 412c, and the guide members 412 may include a guide protrusion 412d in the accommodation groove.

The magnetically suspended bearings (not shown) are each disposed in the connection part 412c of the guide members 412 so as to respectively correspond to both sides of the carrier 431. The magnetically suspended bearings maintain a distance between the carrier 431 and the guide member 412 so that the carrier 431 is moved along the guide members 412 in non-contact with the guide members 412. The magnetically suspended bearings may also be disposed on the second accommodation part 412b of the guide members 412 so as to be disposed on the carrier 431, and in this case, the magnetically suspended bearings may allow the carrier 431 to move along the guide members 412 in non-contact manner with the first accommodation part 412a or the second accommodation part 412b but such that the carrier 431 may maintain a predetermined space from the first accommodation part 412a and the second accommodation part 412b. In order to check a distance between the carrier 431 and the guide members 412, the guide members 412 may include a gap sensor (not shown) that is disposed at the first accommodation part 412a and/or the connection part 412c so as to correspond to a lower portion of the carrier 431. A magnetic force of the magnetically suspended bearings is modified according to a value measured by using the gap sensor, thereby adjusting the distance between the carrier 431 and the guide members 412 in real-time. That is, the carrier 431 may be precisely conveyed by feedback control by using the magnetically suspended bearings and the gap sensor.

The second conveyer unit 420 returns the moving unit 430 from which the substrate 2 has been unloaded from the unloading unit 300 to the loading unit 200 after deposition is completed. The second conveyer unit 420 includes a coil 421, roller guides 422, and the charging track 423 as described above, which are disposed in the lower housing 103. For example, the coil 421 and the charging track 423 may be disposed in an upper portion of the lower housing 103, and the roller guides 422 may be disposed on both inner sides of the lower housing 103. While not illustrated in the drawings, the coil 421 may also be disposed in an ATM box like the coil 411 of the first conveyer unit 410.

Like the coil 411, the coil 421 may be combined with the LMS magnet 431b of the carrier 431 of the moving unit 430 to form a linear motor. The linear motor allows the moving unit 430 to move in a direction (−Y direction) opposite to the first direction (+Y direction).

The roller guides 422 guide the carrier 431 to move in the direction opposite to the first direction. The roller guides 422 are formed to pass through the deposition unit 100. The roller guides 422 support cam followers (not shown) respectively formed on both sides of the carrier 431 of the moving unit 430 to guide the moving unit 430 to move along a direction (−Y direction) opposite to the first direction (+Y direction).

The second conveyer unit 420 performs the function of returning the moving unit 430 from which the substrate 2 has been unloaded, and thus, position accuracy is not needed as the first conveyer unit 410 that conveys the moving unit 430 on which the substrate 2 is loaded such that deposition is performed on the substrate 2. Therefore, magnetic suspension is applied to the first conveyer unit 410 that requires high position accuracy of the moving unit 430 that is being conveyed, thereby obtaining position accuracy, and a conventional roller method is applied to the second conveyer unit 420, thereby simplifying a structure of the deposition apparatus and reducing manufacturing costs. Also, the magnetic suspension may be applied to the second conveyer unit 420 according to necessity as in the first conveyer unit 410.

While the first conveyer unit 410 conveys the substrate 2 loaded on the moving unit 430 in the first direction (+Y direction), the deposition assembly 100-1 deposits a material on the substrate 2 while maintaining a predetermined distance from the deposition assembly 100-1 to the substrate 2. Hereinafter, the deposition assembly 100-1 will be described in detail.

The first deposition assembly 100-1 includes the deposition source 110, a deposition source nozzle unit 120, the patterning slit sheet 130, a shielding member 140, a stage 150, a camera 170, and a sensor 180. All the elements illustrated in FIGS. 3 and 4 may be arranged in the chamber 101 maintained in an appropriate vacuum state. This structure is needed to achieve linearity of a deposition material.

The deposition source 110 may discharge a deposition material. The deposition source 110 may be disposed in a lower portion of the deposition assembly 100-1 and discharge a deposition material toward the substrate 2 (e.g., in an upward direction which is a +Z direction) as the deposition material 115 contained in the deposition source 110 is sublimed or vaporized. In detail, the deposition source 110 includes a crucible 111 that is filled with the deposition material 115 and a heater 112 that heats the crucible 111 so as to vaporize the deposition material 115 filled in the crucible 111.

The deposition source nozzle unit 120 including a deposition source nozzle 121 is arranged in a direction toward the first conveyer unit 410 of the deposition source 110 (+Z direction), that is, toward the substrate 2. Referring to FIGS. 3 and 4, the deposition source nozzle unit 120 includes a plurality of deposition source nozzles 121.

The patterning slit sheet 130 may be disposed to face the deposition source nozzle unit 120; in detail, a plurality of patterning slits may be arranged along a predetermined direction (e.g., an X-axis direction). The patterning slit sheet 130 is disposed between the deposition source 110 and the substrate 2. The deposition material 115 that is vaporized from the deposition source 110 passes through the deposition source nozzle units 120 and the patterning slit sheet 130 to be deposited on the substrate 2, which is a deposition object. When forming a uniform deposition layer over the entire surface of the substrate 2, instead of the plurality of patterning slits, the patterning slit sheet 130 may include an opening that extends along an X-axis. Also, as will be described later, a position of the patterning slit sheet 130 may be changed by the stage 150, and in this embodiment, a direction along which a plurality of patterning slits extend may not be parallel to the X-axis.

The patterning slit sheet 130 may be formed using the same method as that used to form an FMM, in particular, a stripe-type mask, e.g., etching. The deposition source 110 (and the deposition source nozzle unit 120 combined thereto) and the patterning slit sheet 130 may be spaced apart from each other by a certain distance.

In particular, in order to deposit the deposition material 115 that has been discharged from the deposition source 110, and passed through the deposition source nozzle unit 120 and the patterning slit sheet 130, onto the substrate 2 in a desired pattern, it is desirable to maintain a chamber 101 in the same or similar, high vacuum state as that used in a deposition method of an FMM. In addition, the temperature of the patterning slit sheet 130 should be sufficiently lower than that of the deposition source 110 (about 100° C. or less) because thermal expansion of the patterning slit sheet 130 is minimized only when the temperature of the patterning slit sheet 130 is sufficiently low. That is, if the temperature of the patterning slit sheet 130 is increased, sizes or positions of patterning slits of the patterning slit sheet 130 may be changed due to thermal expansion of the patterning slit sheet 130, and a different pattern from a previously set one may be deposited on the substrate 2.

The substrate 2, which is a deposition object, is arranged in the chamber 101. The substrate 2 may be a substrate for a flat panel display device. For example, a large substrate, such as a mother glass, for manufacturing a plurality of flat panel displays, may be used as the substrate 2.

In a conventional deposition method using an FMM, the size of the FMM needs to be the same as that of a substrate. Thus, as the size of the substrate increases, the FMM also needs to be enlarged in size. Due to these problems, it is difficult to use the FMM for a large size of substrate to form a desired film pattern. Moreover, due to self-gravity of the FMM, the FMM may be drooped and it is difficult to form an intermediate layer having an accurate size and a position.

To address these problems, in the deposition apparatus according to the present embodiment, deposition may be performed while the deposition assembly 100-1 and the substrate 2 are moved relative to each other. In other words, while the first conveyer unit 410 conveys the substrate 2 loaded on the moving unit 430 in the first direction (+Y direction), the deposition assembly 100-1 that is spaced apart from the substrate 2 deposits a material on the substrate 2. That is, deposition is performed using a scan and repeat method while the substrate 2 is moved in the arrow direction A illustrated in FIG. 3. Although the substrate 2 is illustrated as being moved in the chamber 101 in the Y-axis direction when deposition is performed, the embodiments of the present invention are not limited thereto. For example, deposition may be performed while the deposition assembly 100-1 is moved in a -Y-axis direction and the substrate 2 is held in a fixed position.

Thus, in the deposition apparatus according to the current embodiment of the present invention, the patterning slit sheet 130 may be much smaller than an FMM used in a conventional deposition method. In other words, in the deposition apparatus, deposition is continuously performed, i.e., using a scan and repeat method while the substrate 2 is moved in the Y-axis direction. Thus, deposition may be sufficiently performed on most of the substrate 2 even when a length of the patterning slit sheet 130 in the Y-axis direction may be much less than a length of the substrate 2 in the Y-axis direction.

Since the patterning slit sheet 130 may be formed much smaller than the FMM used in a conventional deposition method, it is easy to manufacture the patterning slit sheet 130. That is, the small patterning slit sheet 130 is more advantageous in the manufacturing processes, including etching followed by precise elongation, welding, transferring, and washing processes, than the FMM used in a conventional deposition method. In addition, this is more advantageous for manufacturing a relatively large display device.

As described above, the deposition assembly 100-1 deposits a material on the substrate 2 while maintaining a distance between the substrate 2 and the deposition assembly when the first conveyer unit 410 conveys the substrate 2 loaded on the moving unit 430 in the first direction (+Y direction). The patterning slit sheet 130 is spaced apart from the substrate 2 by a predetermined distance during deposition process. In a conventional deposition apparatus using an FMM, the FMM and a substrate are in contact which may cause defects. However, according to the deposition apparatus of the current embodiment of the present invention, these problems may be effectively prevented. In addition, since it is unnecessary to closely contact a substrate with the patterning slit sheet during a deposition process, a manufacturing speed may be significantly improved.

As illustrated in FIGS. 3 and 4, the upper housing 104 may include accommodation parts 104-1 formed on both sides of the deposition source 110 and the deposition source nozzle unit 120, and a stage 150 that adjusts a position of the patterning slit sheet 130 may be disposed on the accommodation parts 104-1. In detail, the stage 150 includes a first stage 151, a second stage 152, two X motors 155 and 156 (see FIG. 5), and a Z motor (not shown), and the patterning slit sheet 130 may be supported by using the first stage 151.

By adjusting the position of the patterning slit sheet 130 with respect to the substrate 2 by using the stage 150, an alignment, in particular, a real-time alignment, between the substrate 2 and the patterning slit sheet 130 may be performed.

In addition, the upper housing 104 and the stage 150 may guide the deposition material such that the deposition material discharged through the deposition source nozzles 121 is not dispersed to unwanted portion of the substrate. That is, the path of the deposition material is limited by the upper housing 104 and the stage 150 such that the movement of the deposition material in the X-axis direction is limited.

For an aligning process, the deposition assembly 100-1 may further include the camera 170 and the sensor 180 to adjust the position of the substrate. The sensor 180 may be a confocal sensor. The camera 170 may generate data to be used in real time alignment of a first alignment mark (not shown) formed in the patterning slit sheet 130 and a second alignment mark (not shown) formed on the substrate 2. The sensor 180 may generate data regarding a distance between the patterning slit sheet 130 and the substrate 2 so that the patterning slit sheet 130 and the substrate 2 are maintained at an appropriate distance from each other.

Since a distance between the substrate 2 and the patterning slit sheet 130 is measurable in real time by using the camera 170 and the sensor 180, the substrate 2 may be aligned with the patterning slit sheet 130 in real time, and thus position accuracy of a pattern may be significantly improved.

Meanwhile, the shielding member 140 may be disposed between the patterning slit sheet 130 and the deposition source 110 in order to prevent deposition of a material in a non-layer forming area. While not shown in detail in FIGS. 3 and 4, the shielding member 140 may be formed of two adjacent plates. As the non-layer forming area is covered by the shielding member 140, deposition of a material in the non-layer forming area of the substrate 2 may be simply and effectively prevented without any additional structure.

Hereinafter, relative movement between the substrate 2 and the patterning slit sheet 130 when forming a layer on the substrate 2 by using the deposition apparatus of FIG. 1 will be described in detail with reference to FIGS. 5 through 9.

As described above, the stage 150 may include the first stage 151, the second stage 152, the two X motors 155 and 156, and the Z motor (not shown), and the patterning slit sheet 130 may be supported by using the first stage 151. The two X motors 155 and 156 may be disposed to contact the first stage 151 so as to adjust a position of the first stage 151 on a XY plane, and as a result, a position of the patterning slit sheet 130 within the XY plane. The two X motors 155 and 156 may be spaced apart from each other along a straight line l in the first direction (Y-axis direction). The two X motors 155 and 156 may move respective contacting portions of the first stage 151, in a second direction (+X direction) that crosses the first direction (Y-axis direction) and in an opposite direction (-X direction) to the second direction.

The two X motors 155 and 156 are disposed on the second stage 152. The Z motor (not shown) may move the second stage 152 having the patterning slit sheet 130 in a direction toward the deposition source nozzle unit 120 (-Z direction) or in an opposite direction to the direction toward the deposition source nozzle unit 120 (+Z direction). The Z motor may be disposed, for example, on the accommodation parts 104-1 (see FIG. 4) of the upper housing 104.

Figure 5:
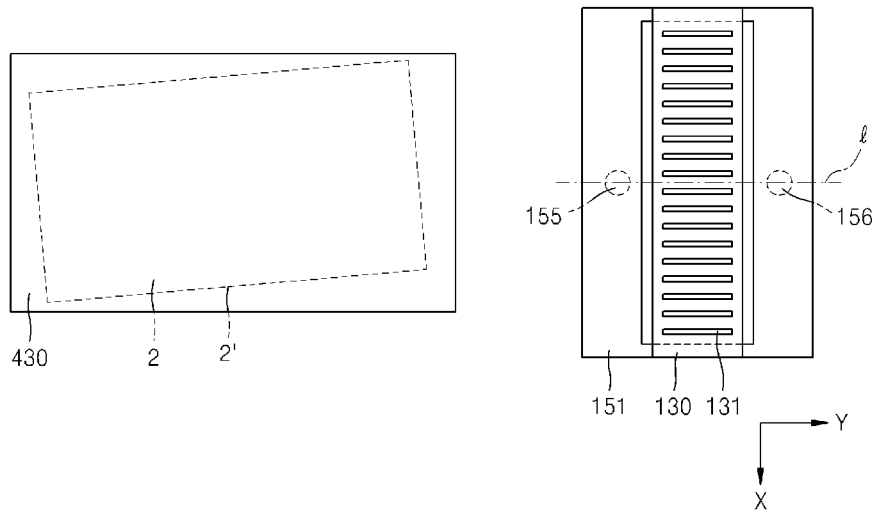
FIGS. 5 through 9 are schematic plan views illustrating relative movement of a substrate and a patterning slit sheet when forming a layer on the substrate by using the deposition apparatus of FIG. 1 according to an embodiment of the present invention.

When the transport robot picks up the substrate 2 from the first rack 212 and places the substrate 2 on the moving unit 430 in the transport chamber 214, the substrate 2 may be deviated from the location in which the substrate should be placed. The substrate 2 may be placed to be rotated with respect to the moving unit 430 as illustrated in FIG. 5. As described above, when the substrate 2 is placed to be rotated with respect to the moving unit 430, it is difficult to form on the substrate 2 a deposition layer having a linear pattern that is parallel to a side 2' of the substrate 2.

Figure 6:
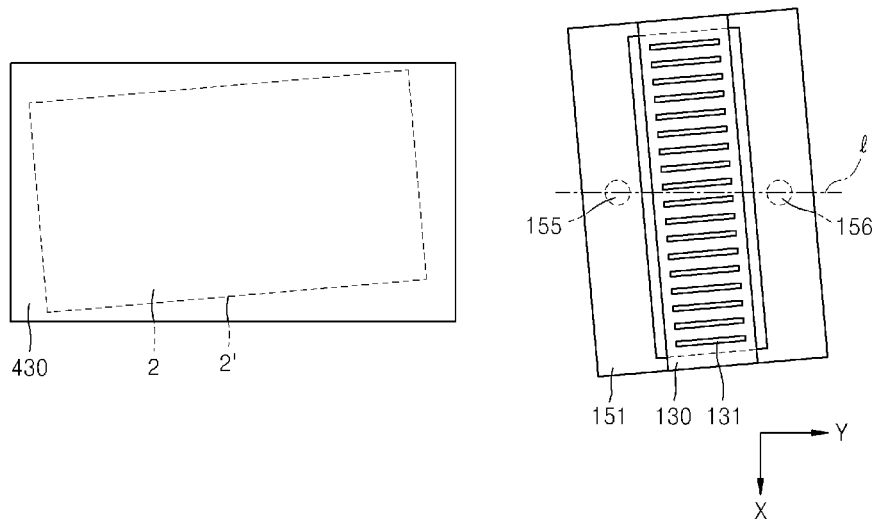

Accordingly, as illustrated in FIG. 6, the patterning slit sheet 130 needs to be rotated before the substrate 2 loaded on the moving unit 430 enters a region corresponding to the patterning slit sheet 130 so that the direction in which the patterning slits 131 of the patterning slit sheet 130 extend becomes parallel to the side 2' of the substrate 2. An angle at which the patterning slit sheet 130 is to be rotated may be determined by using the camera 170 and/or the sensor 180 included in the deposition assembly 100-1. In order to rotate the patterning slits 131, the two X motors 155 and 156 may move the patterning slit sheet 130 by rotating the first stage 151 by moving the contacting portions of the first stage 151. The two X motors 155 and 156 may move the patterning slit sheet 130 in opposite directions and by the same distance. Referring to FIGS. 5 and 6, the X motor 155 moves one set of contacting portions of the first stage 151 in a −X axis direction, and the X motor 156 moves the other set of contacting portions of the first stage 151 in a +X axis direction, thereby rotating the patterning slit sheet 130 in an anti-clockwise direction.

Figure 7:
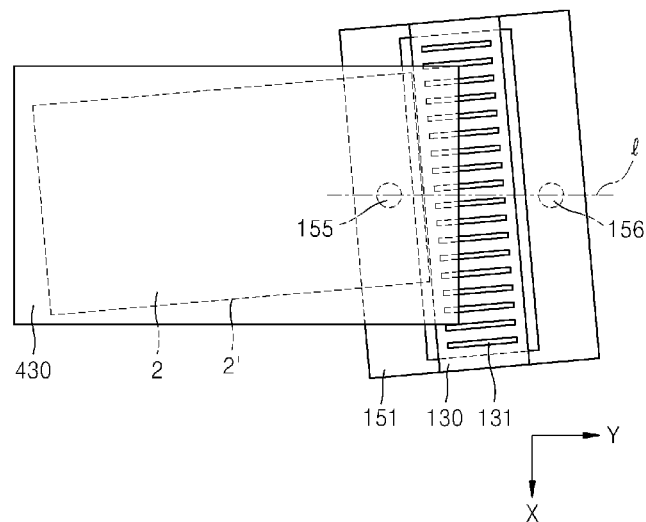
Figure 8:
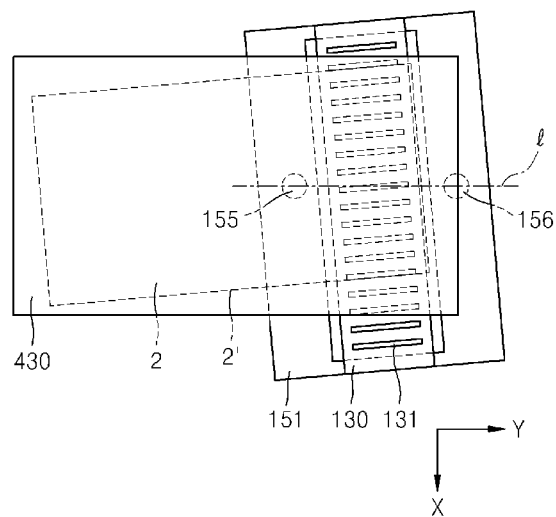
Figure 9:
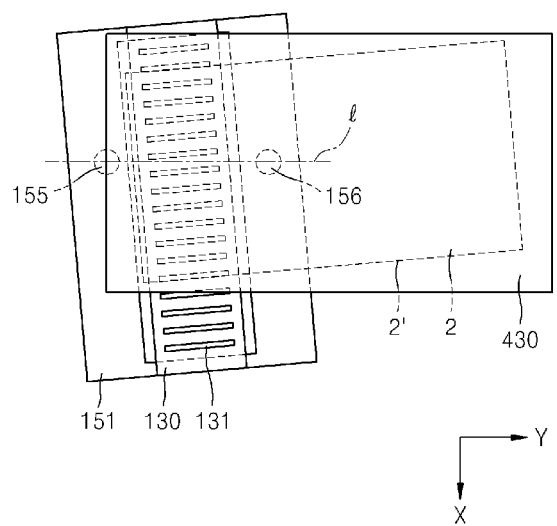

Next, as the moving unit 430 is transported in the first direction (+Y direction), the portions of the first stage 151 in contact with the two X motors 155 and 156 are moved along a second direction substantially perpendicular to the first direction during the forming a deposition layer on the substrate so that the deposition layer having a linear pattern that extends substantially parallel to one of four sides 2' of the substrate 2 on the moving unit 430 may be formed on the substrate 2. as illustrated in FIGS. 7 through 9. Specifically, the two X motors 155 and 156 move the patterning slit sheet 130 in the second direction by the same distance during the forming the deposition layer on the substrate. When the two X motors 155 and 156 rotate the first stage 151 having the patterning slit sheet 130 as shown in FIG. 6, the two X motors move the first stage 151 having the patterning slit sheet 130 in the −X direction perpendicular to the first direction (+Y direction) as illustrated in FIGS. 7 through 9 to compensate the displacement of the location due to the rotation of the stage having the slit sheet 130 on it. The compensation in the position of the patterning slit sheet 130 in the −X axis direction may be performed during which the substrate 2 loaded on the moving unit 430 overlapping the patterning slit sheet 130. In this manner, a deposition layer having a linear pattern that is parallel to the side 2' among four sides of the substrate 2 on the moving unit 430 may be formed on the substrate 2.

In order to adjust the position of the patterning slit sheet 130 on the XY plane, two X motors and a single Y motor may be used as with a typical stage. However, in this case, the stage may have a complicated structure, and an operation of controlling the X motors and the Y motor is also complicated as the two X motors and the single Y motor are used. For example, when the two X motors are operated in different amounts in order to rotate the patterning slit sheet 130, unintended displacement of the Y motor may be caused, making it difficult to control alignment of the patterning slit sheet 130.

However, according to the deposition apparatus of the current embodiment of the present invention, the stage 150 includes just the two X motors 155 and 156 that are spaced apart from each other on the straight line l in the first direction (+Y direction) along which the substrate 2 is conveyed. Thus, alignment accuracy of the patterning slit sheet 130 with respect to the substrate 2 may be remarkably increased by using a relatively simple structure. In particular, since the two X motors 155 and 156 are capable of respectively moving the contacting portions of the first stage 151 in the second direction (+X direction) that is across the first direction (+Y direction) and in the direction (−X direction) opposite to the second direction, and the two X motors 155 and 156 have the same structure, this allows for the reduction of the manufacturing costs and simplification of the manufacturing process of the deposition apparatus.

The virtual straight line l along which the two X motors 155 and 156 are disposed may be parallel to the first direction (+Y direction). In particular, as illustrated in FIGS. 7 through 9, the virtual straight line l may pass through a center of a side of the moving unit 430 conveyed by using the first conveyer unit 410, the side being parallel to the second direction (+X direction). Accordingly, the entire mechanical balance of the deposition assembly 100-1 may be improved. Also, the above-described structure allows that when the patterning slit sheet 130 is disposed at an initial position as illustrated in FIG. 5, the patterning slit sheet 130 is rotated without causing a variation in a position of a center of the patterning slit sheet 130 in the first direction (+Y direction). This further simplifies the control of the position of the patterning slit sheet 130.

Described above is the embodiment in which the two X motors 155 and 156 adjust the position of the first stage 151 that supports the patterning slit sheet 130 within the XY plane and in which the two X motors 155 and 156 are disposed on the second stage 152 and the Z motor (not shown) moves the second stage 152 toward the deposition source nozzle unit 120 (−Z direction) and in an opposite direction thereto (+Z direction). However, the embodiments of the present invention are not limited thereto.

For example, according to a deposition apparatus of another embodiment of the present invention, the Z motor (not shown) may move the first stage 151 that supports the patterning slit sheet 130, toward the deposition source nozzle unit 120 (−Z direction) disposed below, the direction away from the deposition source nozzle unit 120 and in an opposite direction (+Z direction), the direction away from the deposition source nozzle unit 120. The Z motor (not shown) may be disposed on the second stage 152. The two X motors 155 and 156 may adjust the position of the second stage 152 within the XY plane. In this case, the two X motors 155 and 156 may be disposed, for example, on the accommodation parts 104-1 of the upper housing 104 (refer to FIG. 4).

The two X motors 155 and 156 are spaced apart from each other on the virtual straight line l in the first direction (+Y direction), and may move contacting portions of the second stage 152 in the second direction (+X direction) that is across the first direction (+Y direction) and in an opposite direction (−X direction) to the second direction.

Accordingly, the two X motors 155 and 156 may move the contacting portions of the second stage 152 in opposite directions and by the same distance to thereby rotate the second stage 152 having the patterning slit sheet 130. Accordingly, before the substrate 2 loaded on the moving unit 430 overlaps the region corresponding to the patterning slit sheet 130, the second stage 152 may be rotated by moving the respective portions of the second stage 152 contacted by the two X motors 155 and 156 in opposite directions and by the same distance according to an amount of the substrate 2 on the moving unit 430 being rotated with respect to the first direction (+Y direction), so that the direction along which the plurality of patterning slits 131 of the patterning slit sheet 130 extend is parallel to one of four sides 2' of the substrate 2 loaded on the moving unit 430.

After the substrate 2 loaded on the moving unit 430 has begun to enter the region corresponding to the patterning slit sheet 130 and until the substrate 2 has completely passed over the patterning slit sheet 130, while the first conveyer unit 410 conveys the substrate 2 loaded on the moving unit 430, the respective portions of the second stage 152 contacted by the two X motors 155 and 156 are moved along a second direction substantially perpendicular to the first direction so that a deposition layer having a linear pattern that is parallel to one of four sides 2' of the substrate 2 on the moving unit 430 may be formed on the substrate 2. Accordingly, a deposition layer having a linear pattern that is parallel to one of the four sides 2' of four sides of the substrate 2 loaded on the moving unit 430 may be formed on the substrate 2.

The virtual line l along which the two X motors 155 and 156 are disposed may be parallel to the first direction (+Y direction). In particular, as illustrated in FIG. 7 through 9, the virtual line l may pass through a center of a side of the moving unit 430 conveyed by using the first conveyer unit 410, the side being parallel to the second direction (+X direction). Accordingly, the entire mechanical balance of the deposition assembly 100-1 may be improved. When the patterning slit sheet 130 is disposed at an initial position as illustrated in FIG. 5, although the patterning slit sheet 130 is rotated, the rotation of the patterning slit sheet 130 does not cause a variation in a position of a center of the patterning slit sheet 130 in the first direction (+Y direction). This further simplifies the control of the position of the patterning slit sheet 130.

The present invention is not limited to the embodiments described above. For example, a method of manufacturing an organic light emitting display apparatus by using the deposition apparatus is also included in the scope of the present invention.

According to the method of manufacturing an organic light emitting display apparatus of the embodiments of the present invention, the moving unit 430 may be conveyed into the chamber 101 by using the first conveyer unit 410 that is installed to pass through the chamber 101 while the substrate 2 is loaded on the moving unit 430. A layer may be formed such that a deposition material discharged from the deposition assembly 100-1 is deposited on the substrate 2 by moving the substrate 2 relative to the deposition assembly 100-1 by using the first conveyer unit 430 while the deposition assembly 100-1 disposed in the chamber 101 and the substrate 2 are spaced apart from each other by a predetermined distance. After unloading the substrate 2, the moving unit 430 may be returned to the second conveyer unit 420 that is installed to pass through the chamber 101 so that the moving unit 430 may be cyclically moved by using the first conveyer unit 410 and the second conveyer unit 420.

According to the method of manufacturing an organic light emitting display apparatus of the embodiments of the present invention, the deposition assembly 100-1 may have the structure of those described above according to the previous embodiments of the present invention. In this case, in the operation of forming the layer, a layer may be formed by moving respective portions of the first stage 151 contacted by the two X motors 155 and 156 in opposite directions and by the same distance while the first stage 151, that is, the patterning slit sheet 130, is being rotated.

In detail, the first stage 151 may be rotated by moving the respective portions of the first stage 151 contacted by the two X motors 155 and 156 in opposite directions by the same distance according to an amount of the substrate 2 on the moving unit 430 being rotated with respect to the first direction (+Y direction) before the substrate 2 enters the region corresponding to the patterning slit sheet 130, so that the direction along which the plurality of patterning slits 131 of the patterning slit sheet 130 extend is parallel to one of four sides 2' of the substrate 2 loaded on the moving unit 430.

Also, in the forming of a layer, after the substrate 2 loaded on the moving unit 430 has begun to enter the region corresponding to the patterning slit sheet 130 and until the substrate 2 has completely passed through the patterning slit sheet 130, while the first conveyer unit 410 conveys the substrate 2 loaded on the moving unit 430, the respective portions of the first stage 151 contacted by the two X motors 155 and 156 may be moved in the same direction by the same distance so that a deposition layer having a linear pattern that is parallel to one of four sides 2' of the substrate 2 on the moving unit 430 is formed on the substrate 2.

According to the above-described method, even when the substrate 2 is loaded on the moving unit 430 while being rotated with respect to the moving unit 430, a deposition layer having a linear pattern may be formed accurately at a previously set position on the substrate 2. Thus, an organic light emitting display apparatus may be manufactured correctly and efficiently.

According to the method of manufacturing an organic light emitting display apparatus according to the embodiments of the present invention described above, the two X motors 155 and 156 adjust the position of the first stage 151 that supports the patterning slit sheet 130 within the XY plane, and the two X motors 155 and 156 are disposed on the second stage 152 and the Z motor (not shown) moves the second stage 152 toward the deposition source nozzle unit (−Z direction) and in an opposite direction (+Z direction), the direction away from the deposition source nozzle unit 120. However, the embodiments of the present invention are not limited thereto.

For example, according to a method of manufacturing an organic light emitting display apparatus of another embodiment of the present invention, the Z motor (not shown) may move the first stage 151 that supports the patterning slit sheet 130, toward the deposition source nozzle unit 120 (−Z direction) disposed below the patterning slit sheet 130 and in an opposite direction (+Z direction), the direction away from the deposition source nozzle unit 120, and the Z motor (not shown) may be disposed on the second stage 152, and the two X motors 155 and 156 may adjust the position of the second stage 152 within the XY plane.

In the forming of a layer, the first stage 151 may be rotated by moving the respective portions of the second stage 152 contacted by the two X motors 155 and 156 in opposite directions by the same distance according to an amount of the substrate 2 on the moving unit 430 being rotated with respect to the first direction (+Y direction) before the substrate 2 loaded on the moving unit 430 passes over the patterning slit sheet 130, so that the direction along which the plurality of patterning slits 131 of the patterning slit sheet 130 are extended is parallel to one of four sides 2' of the substrate 2 loaded on the moving unit 430. Accordingly, the operation of forming a layer may be started while the predetermined direction along which the plurality of patterning slits 131 of the patterning slit sheet 130 extends is set to be parallel to one of the four sides 2' of the substrate 2.

Also, in the forming of a layer, after the substrate 2 loaded on the moving unit 430 has begun to enter the region corresponding to the patterning slit sheet 130 and until the substrate 2 has completely passed over the patterning slit sheet 130, while the first conveyer unit 410 conveys the substrate 2 loaded on the moving unit 430, the respective portions of the second stage 152 contacted by the two X motors 155 and 156 are moved so that a deposition layer having a linear pattern that is parallel to one of four sides 2' of the substrate 2 on the moving unit 430 may be formed on the substrate 2.

Figure 10:
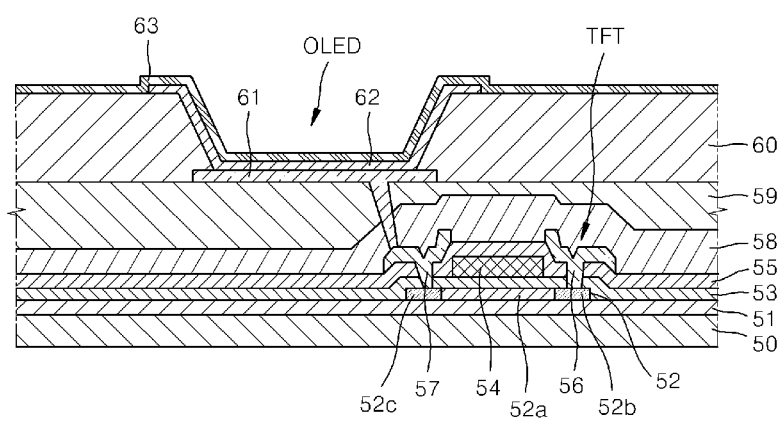
FIG. 10 is a schematic cross-sectional view illustrating an organic light emitting display apparatus manufactured by using the deposition apparatus of FIG. 1 according to an embodiment of the present invention.

FIG. 10 is a cross-sectional view illustrating an organic light-emitting display device manufactured using the deposition apparatus, according to an embodiment of the present invention.

Referring to FIG. 10, various elements of the organic light-emitting display device according to the current embodiment are formed on a substrate 50. The substrate 50 may be the substrate 2 described above with reference to, for example, FIG. 3. The substrate 50 may be formed of a transparent material such as glass, plastic, or metal.

Common layers such as a buffer layer 51, a gate insulating layer 53, and an interlayer insulating layer 55 may be formed on the entire surface of the substrate 50. Also, a patterned semiconductor layer 52 including a channel area 52a, a source contact area 52b, and a drain contact area 52c may be formed on the substrate 50, and also, a gate electrode 54, a source electrode 56, and a drain electrode 57 which are elements of a TFT may be formed together with the patterned semiconductor layer.

In addition, a passivation layer 58 covering the TFT and a planarization layer 59 that is formed on the passivation layer 58 and has an approximately planar upper surface may be formed on the entire surface of the substrate 50. An organic light emitting device (OLED) including a patterned pixel electrode 61, an opposite electrode 63 formed on approximately an entire surface of the substrate 50, and an intermediate layer 62 having a multi-layer structure that is interposed between the pixel electrode 61 and the opposite electrode 63 and includes an emissive layer may be disposed on the planarization layer 59. Alternatively, differently from FIG. 10, the intermediate layer 62 may be a common layer that approximately corresponds to the entire surface of the substrate 50, and some of other layers may be patterned layers that are patterned to correspond to the pixel electrode 61. The pixel electrode 61 may be electrically connected to the TFT through a via hole. Alternatively, a pixel defining layer 60 that covers an edge of the pixel electrode 61 and includes an opening that defines each pixel area may be formed on the planarization layer 59 so as to approximately correspond to the entire surface of the substrate 50.

At least some of elements of the organic light emitting display apparatus may be formed by using the deposition apparatus or the method of manufacturing the organic light emitting display apparatus according to the above-described embodiments of the present invention.

For example, the intermediate layer 62 may be formed by using the deposition apparatus or the method of manufacturing the organic light emitting display apparatus according to the above-described embodiments of the present invention. For example, a hole injection layer (HIL), a hole transport layer (HTL), an emission layer (EML), an electron transport layer (ETL), an electron injection layer (EIL) or the like which may be included in the intermediate layer 62 may be formed by using the deposition apparatus or the method of manufacturing an organic light emitting display apparatus according to the above-described embodiments of the present invention.

That is, when forming any one of layers of the intermediate layer 62, before deposition starts, the two X motors 155 and 156 may appropriately rotate the patterning slit sheet 130, and then deposition may be performed as the patterning slit sheet 130 is moved in a direction (+X direction) that is across the first direction (+Y direction) or in an opposite direction (−X direction) to the direction (+X direction) in real time during the deposition so that a deposition layer having a linear pattern that is parallel to one of four sides 2' of the substrate 2 on the moving unit 430 may be formed on the substrate 2.

A layer that is deposited as described above has a linear pattern. The layer may be, for example, an emission layer.

As described above, when performing deposition on the large-surface substrate by using the deposition apparatus of FIG. 1 or the like, deposition may be performed accurately in a previously set area. Thus, even for an organic light emitting display apparatus having a substrate of a size of 40 inches or greater, an intermediate layer 62 may be accurately formed, thereby providing a high quality organic light emitting display apparatus.

According to the embodiments of the present invention, a deposition apparatus having a simple structure and allowing accurate alignment, a method of manufacturing an organic light emitting display apparatus by using the deposition apparatus, and an organic light emitting display apparatus manufactured by using the method may be provided. However, the scope of the present invention is not limited to the embodiments described above.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing an organic light emitting display apparatus, the method comprising:
   loading a substrate on a moving unit, wherein the moving unit is configured to move along a first direction;
   determining an angle formed between a side of the substrate and an opening in a patterning slit sheet, wherein the side of the substrate and the opening in a patterning slit sheet extends substantially along the first direction;
   rotating the patterning slit sheet by two X motors so that the side of the substrate and the opening in a patterning slit sheet extend along the same direction, a first X motor of the two X motors configured to move the patterning slit sheet in one predetermined direction and a second X motor of the two X motors configured to move the patterning slit sheet in the other predetermined direction opposite to the one predetermined direction while rotating the patterning slit sheet, the first X motor and the second X motor configured to move the patterning slit sheet by the same distance;
   forming a layer on the substrate while conveying the substrate on the moving unit in the first direction in a chamber,
   wherein the patterning slit sheet moves along a direction perpendicular to the first direction during the forming the layer on the substrate so that a deposition layer having a linear pattern that extends along the first direction is formed on the substrate.

2. The method of claim 1, wherein the rotating the patterning slit sheet is performed before the substrate overlaps the patterning slit sheet.

3. The method of claim 2, wherein the patterning slit sheet moves in real time during the forming the layer on the substrate.

4. The method of claim 3, wherein the two X motors are spaced apart from each other along a virtual straight line in the first direction, the virtual straight line passing through a center of the moving unit.

5. The method of claim 3, wherein the two X motors are configured to move the patterning slit sheet in a same direction by the same distance during the forming the layer on the substrate, the same direction substantially perpendicular to the first direction.

6. The method of claim 2, wherein the two X motors are spaced apart from each other along a virtual straight line in the first direction, the virtual straight line passing through a center of the moving unit.

7. The method of claim 2, wherein the two X motors are configured to move the patterning slit sheet in a same direction by the same distance during the forming the layer on the substrate, the same direction substantially perpendicular to the first direction.

8. The method of claim 1, wherein the patterning slit sheet moves in real time during the forming the layer on the substrate.

9. The method of claim 8, the two X motors are spaced apart from each other along a virtual straight line in the first direction, the virtual straight line passing through a center of the moving unit.

10. The method of claim 8, wherein the two X motors are configured to move the patterning slit sheet in a same direction by the same distance during the forming the layer on the substrate, the same direction substantially perpendicular to the first direction.

11. The method of claim 1, the two X motors are spaced apart from each other along a virtual straight line in the first direction, the virtual straight line passing through a center of the moving unit.

12. The method of claim 1, wherein the two X motors are configured to move the patterning slit sheet in a same direction by the same distance during the forming the layer on the substrate, the same direction substantially perpendicular to the first direction.

* * * * *